United States Patent [19]

Kempf et al.

[11] Patent Number: 5,741,621
[45] Date of Patent: Apr. 21, 1998

[54] PROCESS FOR USING PHOTOIMAGEABLE FILMS PREPARED FOR AQUEOUS PHOTOIMAGEABLE LIQUID EMULSIONS

[75] Inventors: Richard Joseph Kempf, Towanda; John Haetak Choi; Harvey Walter Taylor, Jr., both of Sayre, all of Pa.

[73] Assignee: E. I. du Pont de Nemours and Company, Wilmington, Del.

[21] Appl. No.: 771,492

[22] Filed: Dec. 23, 1996

Related U.S. Application Data

[63] Continuation of Ser. No. 474,584, Jun. 7, 1995, abandoned, which is a continuation-in-part of Ser. No. 321,505, Oct. 12, 1994, abandoned, which is a continuation-in-part of Ser. No. 178,718, Jan. 10, 1994, abandoned.

[51] Int. Cl.$^6$ .............. G03C 11/12; G03C 1/805; G03C 11/20; G03C 1/73
[52] U.S. Cl. .............. 430/253; 430/256; 430/262; 430/277.1; 430/281.1; 430/288.1; 430/291; 430/292; 430/293; 430/297; 430/325; 430/332
[58] Field of Search .............. 430/253, 256, 430/262, 277.1, 281.1, 288.1, 291, 292, 293, 297, 325, 332

[56] References Cited

U.S. PATENT DOCUMENTS

| | | | |
|---|---|---|---|
| 4,275,142 | 6/1981 | Hosaka et al. | 430/271.1 |
| 4,369,246 | 1/1983 | Chen et al. | 430/306 |
| 4,542,088 | 9/1985 | Kojima et al. | 430/273.1 |
| 4,692,396 | 9/1987 | Uchida | 430/284 |
| 5,045,435 | 9/1991 | Adams et al. | 430/288.1 |
| 5,230,987 | 7/1993 | Kawanami et al. | 430/284.1 |
| 5,364,737 | 11/1994 | Barr | 430/281.1 |
| 5,387,494 | 2/1995 | Barr et al. | 430/281.1 |
| 5,393,643 | 2/1995 | Lundy et al. | 430/281.1 |
| 5,403,698 | 4/1995 | Tachiki et al. | 430/286.1 |
| 5,501,942 | 3/1996 | Salvin et al. | 430/280.1 |

*Primary Examiner*—George F. Lesmes
*Assistant Examiner*—Bernard P. Codd

[57] ABSTRACT

A process for preparing an image on a substrate by applying a photoimageable composition on a first substrate, wherein the photoimageable composition, having a solids content from 25 to 60 weight percent, contains a partially neutralized acid-containing polymer formed from a precursor polymer having an acid number from 90 to 160 prior to neutralization and wherein 1 to 15% of acid-containing groups of the precursor polymer are neutralized with base; an ethylenically unsaturated monomer; a photoinitiator or photoinitiating system, water; 0–5% by weight a solution polymer, based on the weight of total polymer present in the composition; and 0–25% by weight of an organic solvent based on the total weight of the organic solvent and water; wherein the liquid composition is present as a stable emulsion, and wherein the liquid composition has a Brookfield viscosity, at 25° C., from about 10 to about 2000 centipoise; drying the coated photoimageable composition to form a photoimageable layer on a first substrate; imagewise exposing the layer to form imaged and non-imaged areas; and developing the exposed layer having imaged and non-imaged areas to form an image on the first substrate. The exposed layer may be developed by a wash-off development process, peel-apart development process or by application of a toner which may be in the form of a dry toner or a toning film. Print out images may also be obtained.

18 Claims, No Drawings

PROCESS FOR USING PHOTOIMAGEABLE FILMS PREPARED FOR AQUEOUS PHOTOIMAGEABLE LIQUID EMULSIONS

CROSS-REFERENCE TO RELATED APPLICATIONS

This is a continuation, of application Ser. No. 08/474,584 filed Jun. 7, 1993, now abandoned which is a continuation-in-part of Ser. No. 08/321,505, filed Oct. 12, 1994 which is a continuation-in-part of Ser. No. 08/178,718 filed Jan. 10, 1994, both now abandoned.

FIELD OF THE INVENTION

This invention is directed towards a process for using photoimageable dry films from photoimageable film compositions that are in the form of a stable aqueous emulsion. The photoimageable film includes but is not limited to, photoresist, solder mask, printing plate, and proofing film products.

BACKGROUND OF THE INVENTION

Photoimageable materials are used to form a photoresist layer on a substrate, such as copper-clad glass epoxy, to allow subsequent selective processing of the substrate, such as selective etching or electroplating. Photoimageable materials are also used to form a permanent solder mask layer on an imaged substrate to protect the underlying circuit lines from solder exposure during the later step of soldering in printed circuit board (PCB) manufacture. The use of photoresists and solder masks for manufacture of printed circuit boards (PCBs) is described in Photoresist—Materials and Processes, by William S. DeForest, McGraw-Hill, 1975, in Printed Circuits Handbook, edited by Clyde F. Coombs, Jr., McGraw-Hill, 1979 (2nd Edition), and an Handbook of Printed Circuit Manufacturing by Raymond H. Clark, Van Nostrand Reinhold, 1985. Photoresist and solder mask products that have substantially all of the solvent for coating removed are known as dry films. The use of photoimageable proofing films for off-press proofing in the printing industry is described in Principles of Color Proofing, by Michael H. Bruno, GAMA Communications (Salem, N.H.), 1986.

Aqueous liquid photoresist compositions based on acrylate copolymer binders have been disclosed in U.S. Pat. No. 5,045,435 to Armstrong World Industries. This publication is directed towards liquid photoresist compositions and teaches that at least 25% of the carboxyl-containing binder component of a composition must be neutralized to afford a stable emulsion and/or to afford sufficiently high viscosity of the resulting emulsified composition. A preferred percent neutralization is disclosed of 30–50 percent for dip-coating and 40–60 percent for screen printing. The carboxyl-containing binder has an acid number greater than 80 and a glass transition temperature greater than 60° C.

A water-borne and aqueous developable photoimageable composition comprising two types of binder components, i.e., a solution binder and an emulsion binder, has been disclosed in EPO Patent Publication 0 546 768 A1, published Jun. 16, 1993, to Morton International, Inc. This publication teaches that stable coatable aqueous emulsions of photoimageable compositions are obtained with the use of the two binder types, emulsion and solution. The emulsion binder is dispersed in an aqueous medium as micelles with the aid of surfactant(s). The solution binder is solubilized in the aqueous medium by neutralization with ammonia or a volatile amine to the extent of at least an equal molar amount relative to the carboxylic acid functionality of the solution polymer. The emulsion binder (polymer) has an acid number between 50 and 175, while the solution binder has an acid number between 100 and 250. The emulsion binder and solution binder preferably have molecular weights (number average) of 200,000–250,000 and 100,000–200,000, respectively. Of the total amount of binder polymer, between about 10–50 weight percent is solution polymer and between about 50–90 weight percent is emulsion polymer.

A photopolymerizable composition containing a high molecular weight compound (as the binder) having a polar group and an ethylenic unsaturated compound (as the monomer) that is dispersed in water and an organic solvent is disclosed in U.S. Pat. No. 4,542,088 to Konishiroku Photo Industry Co.. The compositions are limited to those that are dispersed in a solvent composed mainly of an organic solvent, i.e., the weight percentage of organic solvent relative to the total amount of organic solvent and water is greater than 50 percent.

Photoimageable dry film products are currently widely manufactured by coating from an organic solvent (or solvent mixture) such as methylene chloride. Due to increasing pressures from environmental considerations for reducing emissions, particularly of toxic substances, it is becoming increasingly more difficult and less feasible as well as significantly more costly to use organic solvents such as methylene chloride in coating operations for the manufacture of photoimageable materials.

There is a significant need for liquid photoimageable compositions suitable for manufacture of photoimageable dry film that minimizes the presence of organic solvent and preferably eliminates such solvent.

SUMMARY OF INVENTION

The present invention is directed to a process for preparing an image on a substrate comprising, in order:
(i) applying a photoimageable composition on a first substrate, wherein the photoimageable composition, having a solids content from 25 to 60 weight percent, comprises:
(a) a partially neutralized acid-containing polymer formed from a precursor polymer having an acid number from 90 to 160 prior to neutralization and wherein 1 to 15% of acid-containing groups of the precursor polymer are neutralized with base;
(b) an ethylenically unsaturated monomer;
(c) a photoinitiator or photoinitiating system,
(d) water,
(e) 0–5% by weight a solution polymer, based on the weight of total polymer present in the composition, and
(f) 0–25% by weight of an organic solvent based on the total weight of the organic solvent and water;
wherein the liquid composition is present as a stable emulsion, and wherein the liquid composition has a Brookfield viscosity, at 25° C., from about 10 to about 2000 centipoise;
(ii) drying the coated photoimageable composition to form a photoimageable layer on a first substrate;
(iii) imagewise exposing the layer to form imaged and non-imaged areas;
(iv) developing the exposed layer having imaged and non-imaged areas to form an image on the first substrate.

The exposed layer may be developed by a wash-off development process, peel-apart development process or by application of a toner which may be in the form of a dry toner or a toning film. Print out images may also be obtained.

The invention also relates to the above process wherein the exposed layer is developed with an aqueous alkaline developer and wherein photoimageable composition is pigmented.

The invention also relates to a process wherein the photoimageable composition described above further comprises a colorant, and wherein the exposed layer is developed by laminating a second substrate to the surface of the exposed layer having imaged and non-imaged areas and then separating the first and second substrates resulting in the imaged areas remaining on the first substrate and the non-imaged areas being removed on the second substrate.

The invention further relates to a process as described above wherein the photoimageable composition further comprises a colorant, and wherein between steps (ii) and (iii), a second substrate is laminated to the photoimageable layer and to a process wherein the exposed layer is developed by separating the first and second substrates resulting in the imaged areas remaining on the first substrate and the non-imaged areas being removed on the second substrate.

The exposed layer in the above processes may be developed with a dry toner.

The invention also relates to a process wherein the exposed layer is developed by laminating a toning foil comprised of a support and a colorant-containing layer, to the surface of the exposed layer having imaged and non-imaged areas and then separating the first substrate and the toning foil support resulting in the colorant-containing layer remaining in the non-imaged areas of the exposed layer.

The invention relates to a process wherein the photoimageable composition which forms a print-out image upon exposure comprises the following combinations selected from the group consisting of 2,2'-bis(o-chlorophenyl)-4,4', 5,5'-tetraphenyl-1,1'-biimidazole and Leuco Crystal Violet; 1,2-dibromotetrachloroethane and Leuco Crystal Violet; tribromomethyl phenylsulfone (BMPS) and Leuco Crystal Violet; and 2,3- dibromo-3-phenylpropiophenone (BPP) and Leuco Crystal Violet.

The first substrate is a selected from the group consisting of polyethylene terephthalate, metal-clad epoxy glass board, anodized aluminum, paper, polyethylene-clad paper, polycarbonate and polypropylene.

The invention further relates to a process wherein not greater than 10% of the acid groups of the polymer are neutralized, wherein the emulsion is stable for at least twenty four hours, wherein the liquid composition has a Brookfield viscosity at 25° C. of from about 15 to about 500 centipoise, and wherein the liquid composition has a solids content of from 35 to 50 weight percent and to a process wherein the base has a boiling point of at least 90° C. at a pressure of 760 mm of mercury. The base may be selected from the group consisting of ammonium hydroxide, sodium hydroxide and potassium hydroxide or the base has the formula:

wherein $R_1$, $R_2$ and $R_3$ are independently H, C1–C20 substituted or unsubstituted alkyl, C1–C20 substituted or unsubstituted aralkyl, C1–C20 substituted or unsubstituted cycloalkyl, C1–C20 substituted or unsubstituted aryl or at least two of R1, R2 and R3 form a ring structure selected from the group consisting of a single ring and at least two independent rings or the base is triethanolamine, diethanolamine, monoethanolamine, 2-N,N-dialkylaminoalkyl acrylate, or 2-N,N-dialkylaminoalkyl methacrylate.

The process described above may utilize partially neutralized polymer which contain carboxyl groups.

DETAILED DESCRIPTION OF THE INVENTION

In one aspect of the present invention a stable aqueous photoimageable liquid emulsion for proofing uses is disclosed. The term "stable" denotes that the emulsion will maintain its homogenity for a period of at least two hours. Generally the stability will be present for a period of at least twenty-four hours and preferably for at least five days. Although the stable aqueous photoimageable liquid emulsion can be directly employed in application to a final substrate and imaged in a known manner, the emulsion is preferably utilized as a uniform coating on a temporary support with the water removed, i.e., a supported dry film is obtained prior to use on a final substrate. A high solids content of the liquid emulsion preferably minimizes the amount of necessary water which results in less water to be evaporated. However the viscosity of such a high solids content emulsion is generally high which can limit flexibility in direct application to a substrate as a uniform coating.

It is understood that the polymer particles (which serve as a binder in the final dried product) are sufficiently small to allow formation of a stable emulsion or suspension. Illustratively, if the polymer particles are too large, they are incapable of forming such an emulsion or suspension, even under optimum conditions. A proper particle size can be readily determined by, one of ordinary skill in the art. For purposes of illustration, a satisfactory particle size has an average diameter between 0.05 micron (50 nm) and 1 micron (1000 nm). The preferred particle size range is 0.1 micron (100 nm) to, 0.05 micron (50 nm).

For more difficult formulations to form an emulsion, one can add a surfactant to help stabilize the emulsion. Suitable surfactants are those well known in the art and especially include but are not limited to anionic and nonionic surfactants.

The emulsions prepared according to this invention have a Brookfield viscosity at 25° C. ranging from about 10 to about 2000 centipoise and a solids content from 25 to 60 weight percent. Preferably, the Brookfield viscosity at 25° C. is in a range from about 15 to about 500 centipoise, and the solids content is in a range from about 35 to 50 weight percent. Most preferably, the Brookfield viscosity at 25° C. is in a range from about 15 to 200 centipoise and the solids content will range from about 40 to about 50 weight percent.

In a preferred mode the advantages of the present invention include one or more of the following in imaging and processing of a dry film formed from the liquid composition:

1) improved side wall geometry
2) broad development latitude
3) high resolution.

AQUEOUS PHOTOIMAGEABLE LIQUID EMULSION

Partially Neutralized Acid-containing Polymer:

A required constituent of the stable aqueous photoimageable liquid emulsion is a partially neutralized acid-containing polymer. It is considered that the purpose of the partially neutralized polymer is to allow a stable liquid emulsion to exist without unduly limiting the viscosity of the emulsion, i.e., a high degree of neutralization outside the scope of the invention can directly result in an unduly high viscosity of the final formulation.

A precursor acid-containing polymer prior to neutralization will have an acid number from 90 to 160. Preferred acid groups are carboxylic acid groups.

It is required that the present neutralization of the precursor acid-containing polymer be not greater than 15%, i.e., not greater than 15% of the acid-containing groups are neutralized. A minimum amount of neutralization is 1%. A preferred range is 2 to 10%, and a more preferred, more narrow range is 4 to 8%.

Although higher degrees of polymer neutralization will result in stable emulsions and will, for example, allow formation of photoresists, it is considered that one or more detrimental properties are introduced solely due to the higher degree of neutralization of the acid groups of the binder polymer. An example of a detrimental property which has been found in specific instances is poor side wall geometry.

The neutralization is undertaken with a base which can be inorganic or organic. Examples of inorganic bases are sodium hydroxide, potassium hydroxide, ammonium hydroxide and ammonium carbonate. Although ammonia can be employed, it is not preferred. Examples of organic bases include amines with the formula:

$$NR_1R_2R_3$$

wherein $R_1$, $R_2$ and $R_3$ are independently C1–C20 substituted or unsubstituted alkyl, C1–C20 substituted or unsubstituted aralkyl, C1–C20 substituted or unsubstituted cycloalkyl, C1–C20 substituted or unsubstituted aryl or at least one of $R_1$, $R_2$ and $R_3$ is H or at least two of $R_1$, $R_2$ and $R_3$ form a ring structure selected from the group consisting of a single ring and at least two independent rings. Suitable substituents for the substituted C1–C20 alkyl groups include but are not limited to hydroxyl, alkyl acrylate and alkyl methacrylate. Examples of suitable amines are triethanolamine, diethanolamine, monoethanolamine, 2-N,N-dialkylaminoalkyl acrylate, and 2-N,N-dialkylaminoalkyl methacrylate.

Preferred bases due to ease of application have a boiling point of at least 90° C. at 760 mm. More preferred bases have boiling points of at least 120° C. (at 760 Mm Hg 1 atmosphere) and still more preferred bases have boiling points of at least 200° C. (at 760 Mm Hg, 1 atmosphere).

Acid-containing polymers are well known in the prior art and are suitable in the present invention as precursor polymers provided the acid number is from 90 to 160.

The polymers present in the compositions of this invention must contain acid functionality, which is preferably achieved by incorporating one or more carboxyl-containing comonomers into the binder polymer. Preferred polymers for the instant invention also contain styrene as a comonomer. Suitable polymers for the instant invention contain 0–50 weight percent styrene as comonomer, have an acid number in the range 90–160, have a molecular weight (weight average) in the range 20,000–300,000, and have a glass transition temperature in the range 50°–120° C. Preferably, the binders contain 5–40 % styrene as comonomer, have an acid number in the range 110–140, have a molecular weight (weight average) in the range 40,000–200,000, and have a glass transition temperature in the range 60°–110° C. Most preferably, the polymers contain 10–30% styrene as comonomer, have an acid number in the range 125–135, have a molecular weight (weight average) in the range 60,000–100,000, have a glass transition temperature in the range 70°–100° C., and comprise a polymer(s) that has been polymerized using a persulfate compound (i.e., sodium, potassium, or ammonium persulfate) as the initiator for the polymerization. Use of persulfate compounds as initiators is most preferred as their use affords particularly stable polymer emulsions. While not being bound by a particular theory with regard to why use of persulfates affords stable emulsions, it is recognized that use of persulfates will introduce some charged sulfate groups onto the surface of the emulsion particles which may serve to stabilize the resulting emulsion made according to this invention by raising the electrical potential of the emulsion particles. The polymer emulsions may also be prepared by conventional techniques known to one skilled in the art.

Preferred polymer binders are acid-containing copolymers or homopolymers comprised of at least one acid-containing monomer of structural unit:

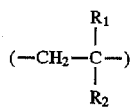

in which $R_1$ is H, phenyl, or alkyl; $R_2$ is $CO_2R_3$, $SO_3R$, or other acidic functional group; and R and $R_3$ are H or alkyl, which is unsubstituted or hydroxyl-substituted. Alkyl groups tan contain one to twelve carbon atoms and preferably one to eight. Comonomers, which are suitable for forming the binder copolymer, are styrene and unsaturated carboxylic acids and their derivatives, such as (meth)acrylic acid and (meth) acrylates. Acrylic acid, methacrylic acid, methyl methacrylate, styrene, ethyl acrylate, ethyl methacrylate, butyl methacrylate, butyl acrylate, maleic anhydride, 2-hydroxyethyl methacrylate, and 2-ethylhexyl methacrylate are preferred.

Suitable binder copolymers can be formed by direct copolymerization of one or more ethylenically unsaturated dicarboxylic acid anhydrides, or the corresponding alkyl diesters, with one or more of the above comonomers. Suitable ethylenically unsaturated dicarboxylic acid anhydrides are, for example, maleic anhydride, itaconic acid anhydride and citraconic acid anhydride and alkyl diesters such as the diisobutyl ester of maleic anhydride. The copolymer binder containing acid anhydride functionality can be reacted with primary aliphatic or aromatic amines to produce acid and amide functionality.

A preferred acid-containing binder for aqueous processability in use as well as aqueous coatability in dry film manufacture is a carboxylic acid-containing copolymer, such as those disclosed in U.S. Pat. Nos. 3,458,311 and 4,273,857, and which can be prepared by any of the addition polymerization techniques known to those skilled in the art such as described therein. The level of carboxylic acid groups is determined for a given composition by optimizing the amount needed for good development in aqueous alkaline developer.

When an aqueous processable photoresist or solder mask is laminated to a substrate and photoprinted, development of the photoresist or solder mask composition may require that the binder material should contain sufficient carboxylic acid groups to render the photoresist or solder mask coating composition processable in aqueous alkaline developer. The photoresist or solder mask coating layer will be removed in portions which are not exposed to radiation but will be substantially unaffected in exposed portions during development by aqueous alkaline liquids such as wholly aqueous solutions containing 1% sodium carbonate by weight at a temperature of 30° C.

Ethylenically Unsaturated Monomer;

A further required constituent of the stable aqueous photoimageable liquid emulsion is an ethylenically unsaturated monomer. Suitable monomers useful herein are well known in the prior art and typically undergo free radical initiated polymerization. The composition contains at least one or a mixture of such components. In general, preferred monomers for photopolymer applications have boiling points greater than 100° C. (at 760 Mm Hg, 1 atmosphere), more preferably, greater than 150° C. (at 760 Mm Hg, 1 atmosphere). Numerous unsaturated monomers polymerizable by free-radical initiated polymerization and useful in photopolymerizable compositions are known to those skilled in the art.

The monomer provides the capability of the photoresist coating composition to photopolymerize and contributes to overall properties. In order to effectively do so, the monomer should contain at least one ethylenically unsaturated group capable of undergoing polymerization on exposure to actinic radiation.

The preferred monomeric compounds are polyfunctional, but monofunctional monomers, such as (meth) acrylate esters of polycaprolactone, can also be used. Suitable monomers which can be used as the sole monomer or in combination with others include the following: diethylene glycol diacrylate, tripropylene glycol diacrylate, trimethylolpropane triacrylate, pentaerythritol triacrylate, ethoxylated trimethylolpropane tri(meth) acrylate, propoxylated trimethylolpropane tri(meth) acrylate and similar compounds as disclosed in U.S. Pat. No. 3,380,831, triethylene glycol dimethacrylate, bisphenol A di(meth)-acrylate, di-(2-methacryloxyethyl) ether of bisphenol-A, di-(3-acryloxy-2-hydroxypropyl) ether of bisphenol-A, di-(2-acryloxyethyl) ether of bisphenol-A, di-(3-methacryloxy-2-hydroxypropyl) ether of tetrachloro-bisphenol-A, di-(2-methacryloxyethyl) ether of tetrachloro-bisphenol-A, di-(3-methacryloxy-2-hydroxypropyl) ether of tetrabromo-bisphenol-A, di-(2methacryloxyethyl) ether of tetrabromo-bisphenol-A, ethoxylated bisphenol-A di(meth) acrylate, propoxylated bisphenol A di(meth)-acrylate, diacrylate of bisphenol-A diglycidyl ether and poly-caprolactone diacrylate.

A particularly preferred class of comonomers is tripropylene glycol diacrylate, trimethylolpropane triacrylate, ethoxylated trimethylolpropane triacrylate, propoxylated trimethylolpropane triacrylate, ethoxylated Bisphenol A dimethacrylate, and triethylene glycol dimethacrylate.

Photoinitiator or Photoinitiator System:

The photoinitiator or photoinitiating system includes one or more compounds which directly furnish free-radicals when activated by actinic radiation. By "actinic radiation" is meant radiation which allows formation of the free-radicals necessary to initiate polymerization of the monomer. This photoinitiating system can also include a plurality of compounds, one or more of which yields the free-radicals after having been caused to do so by another compound, or sensitizer, which is activated by the radiation. The sensitizer may extend spectral response into the near ultraviolet, visible, and near infrared spectral regions. Also radiation employing a laser can be employed in specific situations.

Photoinitiators are discussed in: "Photopolymers: Radiation Curable Imaging Systems" by B. M. Monroe in Radiation Curing: Science and Technology, S. P. Pappas, Ed, Plenum, New York, 1992, pp. 399–440, and by K. K. Dietliker, in Chemistry and Technology of UV and EB Formulation for Coatings, Inks, and Paints, "Free-Radical Polymerization", P. K. T. Oldring, Ed, SITA Technology Ltd, London, Vol. 3, 1991, pp 60–525.

The photoinitiator or photoinitiator system can be of a specific type, such as a halogenated-2,5-cyclohexadieneone, benzophenone, alkylaryl ketone or diketone type, or mixtures thereof. Any of a variety of free radical generating photoinitiators can be used to initiate polymerization in dry film photoresists and solder mask compositions manufactured according to this invention. Benzophenone derivatives such as benzophenone, bis-4,4'-dimethylaminobenzophenone (Michler's ketone), bis-4,4'-diethylaminobenzophenone (ethyl Michler's ketone), benzophenones singly or multiply substituted with other alkylamino groups, chloro, methoxy etc. are often widely employed as photoinitiators. Preferred compounds include benzophenone, ethyl Michler's ketone, and Michler's ketone. Also substituted xanthones, thioxanthones, anthrones, and fluorenones are useful initiators, with alkyl, chloro, and alkoxy substituted thioxanthones being preferred. Substituted cyclohexadieneones such as those described in Sysak, U.S. Pat. No. 4,341,860 can be also be used, with preferred compounds having both an alkyl and a trichloromethyl substituent in the position.

The substituted 2,4,5,2',4',5'-hexaarylbiimidazole dimers (HABIs) are compounds which are often preferred in photoinitiator systems and are disclosed in: Chambers, U.S. Pat. No. 3,479,185; Cescon, U.S. Pat. No. 3,784,557; Dessauer, U.S. Pat. No. 4,311,783; and Sheets, U.S. Pat. No. 4,622,286. Preferred dimers of this class are 2-o-chlorosubstituted hexaphenylbiimidazoles in which the other positions on the phenyl radicals are unsubstituted or substituted with chloro, methyl or methoxy, such as: CDM-HABI, i.e., 2-(o-chlorophenyl)-4,5-bis(m-methoyphenyl)-imidazole dimer; o-Cl-HABI, i.e., biimidazole, 2,2'-bis (o-chlorophenyl)-4,4'5,5'-tetraphenyl-; and TCTM-HABI, i.e., 1H-imidazole, 2,5-bis(o-chloro-phenyl)-4-[3,4-dimethoxyphenyl]-, dimer, each of which is typically used with a hydrogen donor or chain transfer agent. The most preferred initiator of this class is ortho-Cl-HABI, i.e., 1,1'-biimidazole, 2,2'-bis(ortho-chlorophenyl)-4,4',5,5'-tetraphenyl-imidazole dimer.

Some especially preferred photoinitiators and photosensitizers are ortho-Cl-HABI, benzophenone, ethyl Michler's ketone, p-dialkylaminobenzaldehydes, p-dialkylaminobenzoate alkyl esters, cyclohexadieneones, xanthones, thioxanthones, benzil dialkyl ketals, aminoacetophenones, benzoin, benzoin dialkyl ethers, or combinations thereof where alkyl contains 1 to 4 carbon atoms.

The quantity of total photoinitiator system in a photopolymerizable composition is typically from 0.5 to 10 parts by weight relative to the total components.

Optional Additives and Materials of Construction:

In most instances in the practice of this invention and in a preferred mode, water alone is used as the dispersing medium to afford an aqueous coating emulsion. However, when needed, an organic solvent may be included in a semiaqueous emulsion formulation with the liquified ingredients to impart solubility to an otherwise difficult to dissolve ingredient or as a coalescing agent. Suitable organic solvents, if employed, include methanol, ethanol, isopropanol, n-propanol, n-butyl alcohol, propylene glycol monomethyl ether, propylene glycol monoethyl ether, propylene glycol monobutyl ether, ethylene glycol monoethyl ether, ethylene glycol monobutyl ether, propylene glycol monopropyl ether, propylene glycol t-butyl ether, and dipropylene glycol monoethyl ether, and they can be employed alone or in combination. In all cases, the amount of organic solvent relative to the total amount of organic solvent and water that is used, if employed, is less than 25 weight percent.

It is understood that the photoimageable film compositions of this invention may contain small amounts of solution polymer that may be made by solution polymerization, such as poly(vinylpyrrolidone/vinylacetate) copolymer, which functions to reduce cold flow in the photoimageable dry film during storage. However, a solution polymer, if present, will be at a concentration less than 5 percent by weight, preferably less than 3 percent by weight, and most preferably less than 2 percent by weight on the basis of total binder polymer.

Various surfactants can optionally be included in the emulsion to further stabilize the emulsion. Artionic, cationic, and nonionic surfactants can be employed; nonionic surfactants are preferred. An especially preferred class of nonionic surfactants are ethylene oxide and propylene oxide homopolymers and copolymers.

In the case of a photoimageable solder mask composition, there will be in addition to the key components listed above a crosslinking agent present to provide for curing of the imaged resist. Suitable crosslinking agents include an adduct of a polyisocyanate compound and a isocyanate group blocking agent, and formaldehyde condensation resins with melamines, ureas, benzguanidines, and the like.

Other compounds conventionally added to photoresist and solder mask photopolymer compositions may also be present in the coating to modify the physical properties of the film. Such components include: adhesion modifiers, thermal stabilizers, a printout image system comprising colorants such as dyes and pigments, viscosity control agents, coating aids, wetting agents, surfactants, release agents, fillers, crosslinking agents, and the like.

Examples of suitable printout image systems are the following: 2,2'-bis(o-chlorophenyl)-4,4',5,5'-tetraphenyl-1, 1'-biimidazole and Leuco Crystal Violet (LCV); 1,2-dibromotetrachloroethane and LCV; tribromomethyl phenylsulfone (BMPS) and LCV; and 2,3-dibromo-3-phenylpropiophenone (BPP) and LCV.

Some heterocyclic compounds improve adhesion of the coating to copper-clad substrates or prevent residue formation during processing. Suitable heterocyclic components include materials such as those disclosed in Hurley et al., U.S. Pat. No. 3,622,334, Jones, U.S. Pat. No. 3,645,772, and Weed, U.S. Pat. No. 4,710,262. Preferred heterocyclic components include benzotriazole, 5-chloro-benzotriazole, 1-chlorobenzotriazole, 4- and 5-carboxy-benzotriazole, 1,1-hydroxy-benzotriazole, 2-mercapto-benzoxazole, 1H-1,2,4-triazole-3-thiol, 5-amino-1,3,4-thiodiazole-2-thiol, and mercapto-benzimidazole.

Thermal polymerization inhibitors that can be used in the coating compositions are: p-methoxyphenol, hydroquinone, alkyl- and aryl-substituted hydroquinones and quinones, tert-butyl catechol, 2,6-di-tert-butyl-p-cresol, and phenothiazine. Also useful for thermal polymerization inhibitors are the nitroso compositions disclosed in U.S. Pat. No. 4,168,982.

Various dyes and pigments may be added to increase the visibility of the resist image. Any colorant used, however, should preferably be transparent to the actinic radiation. Representative dyes include leuco crystal violet, Victoria green dye, and Victoria blue dye.

The preferred ranges for the composition of the photoresist and solder mask are about 30 to 80 parts by weight of the polymer; about 10 to 50 parts by weight of monomer; and about 0.5 to 10 parts by weight of the photoinitiator system.

The thickness of the photoimageable layer will depend on the, type of processing being done.

Any of the support films known for use as such for a photoimageable coating can be used as a temporary support for coating the photoimageable material onto in the application of the present invention. The temporary support film, which preferably has a high degree of dimensional stability to temperature changes, may be chosen from a wide variety of polyamides, polyolefins, polyesters, vinyl polymers, and cellulose esters, and may have a thickness of from about 6 to 200 microns. A particularly suitable support film is polyethylene terephthalate having a thickness of about 25 microns.

In a photoimageable film it is necessary or at least highly desirable to protect the photosensitive layer by a removable cover film in order to prevent blocking when it is stored in a roll form. The protective cover film is removed prior to lamination of the photoimageable element to a substrate.

The protective cover film may be selected from the same group of high polymer films described for the temporary support film, supra, and may have the same wide range of thicknesses; however, it is preferable to use a cover sheet that is relatively flexible under lamination conditions. A cover sheet of 25 microns thick polyethylene or polypropylene is especially suitable.

Manufacturing Process:

The process of formation of a dry film is relatively simple and direct. The stable liquid photoimageable composition of the present invention is coated onto a substrate which may be permanent or temporary. Various methods of coating can be employed which are well known in the art.

Substantially all water in the liquid composition is removed which results in a dry film. Since a relatively high solids content is present in the liquid, under preferred conditions it is considered that a relatively small amount of liquid has to be removed in forming a dry film. If an organic solvent is also employed, it is also removed in the drying process.

PROCESS OF USE

The stable aqueous photoimageable liquid emulsion may be used to prepare photoresists, soldermasks, printing plates, and proofing products. These compositions are applied to a substrate by coating or lamination if a dry film as described above is prepared. After drying, the coating is imagewise exposed to actinic radiation, generally through a process negative or positive transparency after a draw-down time of 30 seconds to 2 minutes. The transparency is an image bearing transparency consisting solely of substantially opaque and substantially transparent areas where the opaque areas are substantially of the same optical density. The compositions used in the process of the invention generally exhibit their maximum sensitivity in the ultraviolet range, therefore the radiation source should furnish an effective amount of this type of radiation. Suitable radiation sources include carbon arcs, mercury-vapor arcs, fluorescent lamps with special ultraviolet-emitting phosphors, argon glow lamps, electronic flash units and photographic flood lamps. The radiation exposure time can vary from fractions of a second to minutes depending on the intensity, type of radiation source used and its distance from the photoimageable layer and the type of photoimageable layer. In general exposure times range from 10 seconds to 10 minutes or more using standard commercial radiation sources.

Following imagewise exposure to form imaged and non-imaged areas in the photoimageable composition, and removal of the cover sheet, if present, the exposed layer is developed to form an image on the first substrate. Preferably, developing of the exposed layer having imaged and non-imaged areas to form an image on the first substrate is a dry development step. The exposed layer may be developed using an aqueous alkaline developer which will remove the non-imaged areas leaving a relief image. If the first substrate is a copper-clad epoxy glass substrate, then the image formed is a resist image which may be used as a mask for etching or plating the copper exposed areas of the first substrate If the first substrate is a metal substrate, such as anodized aluminum, then a printing plate results. The photoimageable layer may be pigmented resulting in a proofing product after wash-off development.

The exposed layer may also be developed by toning with a toning foil or film or by dusting with a powdered toner. Useful toning films are described in Froehlich, U.S. Pat. No. 3,625,014, issued Jul. 6, 1987. The films, which are comprised of a support and a low cohesive strength, pigmented polymer layer, are laminated to the exposed layer having imaged and non-imaged areas. The support is peeled off along with the pigmented polymer adjacent the imaged areas on the first substrate. In general, it is necessary to apply the toning film more slowly than usual lamination rates and some experimentation may be required to determine optimum rates and temperatures for laminating each different toning film.

Although there are a number of advantages associated with toning films, there are also potential problems, including the propensity of such films to trap dirt, which then becomes a background artifact in the final proof. On the other hand, the use of particulate toners to prepare prepress proofs is an established technology. Dry non-electroscopic toners, their method of production, as well as improved surface coatings; are well known in the art, as for example in Chu and Manger, U.S. Pat. No. 3,620,726; Gray, U.S. Pat. No. 3,909,382; Fickes et al., U.S. Pat. No. 4,215,193; Fickes, U.S. Pat. No. 4,397,941; and Matrick, U.S. Pat. No. 4,546,072. The toner is applied to the exposed layer having non-tacky, imaged areas and tacky non-imaged areas. Excess toner is wiped off, providing a toner image on the first substrate.

The exposed layer having imaged and non-imaged areas may also be developed by peel-apart development. In this embodiment the photoimageable layer may be pigmented. A second substrate may be laminated to the photoimageable layer prior to the exposure step or after formation of the imaged and non-imaged areas in the exposed layer. The second substrate is then peeled off, resulting in the imaged areas remaining on the first substrate and the non-imaged areas being removed on the second substrate. If the photoimeageable layer is unpigmented, the tacky non-imaged areas that are removed with the second substrate may be treated with dry particulate toners or toning films as described above.

The invention will now be illustrated, but not limited, by the examples.

EXAMPLES

In the following examples, all parts and percentages are by weight and all temperatures are in degrees Centigrade unless otherwise indicated.

DEFINITIONS:

The term "solution binder" or "solution polymer" is defined to be a polymer which has been made in an organic solvent(s) from its constituent monomers.

The term "acid number" is defined to be mg of potassium hydroxide required to neutralize the acid functionality of 1 g of dry binder (polymer).

Example 1:

A photopolymer emulsion was prepared having the following composition:

| INGREDIENTS | WT (GRAMS) | | |
|---|---|---|---|
| | SAMPLE A | SAMPLE B | SAMPLE C |
| Latex Polymer A* Stabilizer: | 167.06 | 171.41 | 158.76 |
| Deionized Water | 36.00 | 33.96 | 38.30 |
| Triethanolamine | 3.00 | 2.83 | 3.19 |
| Liquid Mixture: | | | |
| Dodecylbenzenesulfonic acid | 4.89 | 4.61 | 5.20 |
| Trichloro-dimethoxy-hexaarylbisimidazole | 3.50 | 3.30 | 3.72 |
| Syloid ® 63 | 4.07 | 3.84 | 4.33 |
| Syloid ® 620 | 0.78 | 0.73 | 0.83 |
| Ortho-phenyl phenol ethoxylate | 16.86 | 15.90 | 17.93 |
| N-ethyl-para-toluene-sulfonamide | 18.89 | 17.82 | 20.10 |
| Tris(2-methyl-4-diethylaminophenyl) methane | 2.08 | 1.96 | 2.21 |
| Triethanolamine triacetate | 11.02 | 10.39 | 11.72 |
| 9,10 Phenanthrenequinone | 0.55 | 0.52 | 0.59 |
| Pyrenequinone,1,6- & 1,8- | 0.01 | 0.01 | 0.01 |
| Liquid Mixture Total: | 62.63 | 59.09 | 66.63 |
| Deionized Water | 31.30 | 29.70 | 33.11 |

*Latex polymer A is poly(methylmethacrylate/ethyl acrylate/ styrene/ methacrylic acid), 21/38/20/21 Mol. Wt. about 60,000 prepared by standard emulsion polymerization techniques, in which 0.5% of monomer feed was ammonium persulfate initiator, 0.34% of monomer feed was ammonium carbonate as buffer, and 1% of monomer feed was 31/1 block copolymer of propylene oxide/ethylene oxide as a steric stabilizer. The percent solids was 51.2%.

Each of the above emulsions was coated on a Dylux® paper (E. I. dupont de Nemours and Co., Wilmington, Del.) at 20 feet per minute (6.10 meter/minute) and dried to form high quality dry papers. The dried coatings were tested by placing them in a light source (5 kw Violux with a Theimer Montakop vacuum frame, Siegfried Theimer, W. Germany), with a negative transparency. After imaging for 20 seconds, the exposed papers were fixed for 350 seconds using a Dylux® Clearing filter (DuPont). Each paper displayed an excellent blue image with each having a different surface tack.

Example 2:

A photopolymer emulsion was prepared having the following composition:

| INGREDIENTS | WT (%) |
|---|---|
| Latex Polymer A Stabilizer: | 40.00 |
| Deionized Water Triethanolamine Liquid Mixture: (PART A) | 2.00 |
| Celrad 3704 | 17.936 |
| Triacetin | 6.730 |
| Benzophenone | 3.000 |
| Trimethylolpropane | 5.070 |
| p-methoxyphenol | 0.022 |
| N,N-diethylhydroxylamine | 0.092 |
| 2,3-diazabicyclo [3.2.2]non-2-ene,1,4,4,-trimethyl-2,3-dioxide | 0.050 |

-continued

| INGREDIENTS | WT (%) |
| --- | --- |
| Poly(caprolactone) | 0.500 |
| Trimethylolpropane trimethacrylate (PART B) | 13.620 |
| Derivative of 3-phenyl-7-triazinylamino-coumarin | 1.500 |
| 2-benzoxazolethiol | 0.830 |
| Ethyl Michler's ketone (PART C) | 0.150 |
| 1-H-imidazole,2-(2-chlorophenyl)-4,5-diphenyl | 1.000 |
| Liquid Mixture Total: | 50.500 |
| % Solid (adjusted with deionized water) | 50.0 |

The above emulsion was coated on 48S Mylar® polyester film (DuPont) at a coating weight of 90 mg/dm² and dried at 80° C. to form a high quality dry film. The film was laminated to a Cromalin® CR-1 paper receptor (DuPont) using a Cromalin® laminator (DuPont), at a roll temperature of 115.5° C. and a throughput speed of 20.32 cm/min (8 fpm). After a 2 minute draw-down, the resulting laminate was exposed from the polyester film side through a yellow positive separation transparency, for 14 seconds, in a light source (5 kw Violux with a Theimer Montakop vacuum frame, Siegfried Theimer, W. Germany). The element was removed from the vacuum frame, the polyester film was peeled off, and the image was toned with a Cromalin® yellow positive toner (DuPont) to yield a yellow image corresponding to the positive transparency.

The process was sequentially repeated by laminating additional photopolymer emulsion coatings similar to that described above onto the yellow image containing receptor; exposing using magenta, cyan and black separations; removing the support and toning with the respective colored toners to yield a high quality four color positive proof. Corona treated cover sheets were utilized for multilayer applications. An extra layer of photosensitive material was applied and blanket exposed to provide a protective coversheet to the proof.

Example 3:

Example 2 was repeated with the following exception: the photopolymer emulsion used had the following composition:

| INGREDIENTS | WT (%) |
| --- | --- |
| Latex Polymer A Stabilizer: | 47.50 |
| Deionized Water Triethanolamine Liquid Mixture: (PART A) | 2.00 |
| Celrad 3704 | 17.936 |
| Triacetin | 6.730 |
| Benzophenone | 3.000 |
| Trimethylolpropane | 5.070 |
| p-methoxyphenol | 0.022 |
| N,N-diethylhydroxylamine | 0.092 |

-continued

| INGREDIENTS | WT (%) |
| --- | --- |
| 2,3-diazabicyclo[3.2.2]non-2-ene,1,4,4,-trimethyl-2,3-dioxide | 0.050 |
| Poly(caprolactone) | 0.500 |
| Trimethylolpropane trimethacrylate (PART B) | 13.620 |
| Derivative of 3-phenyl-7-triazinylamino-coumarin | 1.500 |
| 2-benzoxazolethiol | 0.830 |
| Ethyl Michler's ketone (PART C) | 0.150 |
| 1-H-imidazole,2-(2-chlorophenyl)-4,5-diphenyl | 1.000 |
| Liquid Mixture Total: | 50.500 |
| % Solid (adjusted with deionized water) | 50.0 |

A four color positive proof was obtained following the process described in Example 2.

Example 4:

Example 2 was repeated with the following exception: the photopolymer emulsion used had the following composition:

| INGREDIENTS | WT (%) |
| --- | --- |
| Latex Polymer A Stabilizer: | 55.00 |
| Deionized Water Triethanolamine Liquid Mixture: (PART A) | 2.00 |
| Celrad 3704 | 17.936 |
| Triacetin | 6.730 |
| Benzophenone | 3.000 |
| Trimethylolpropane | 5.070 |
| p-methoxyphenol | 0.022 |
| N,N-diethylhydroxylamine | 0.092 |
| 2,3-diazabicyclo[3.2.2]non-2-ene,1,4,4,-trimethyl-2,3-dioxide | 0.050 |
| Poly(caprolactone) | 0.500 |
| Trimethylolpropane trimethacrylate (PART B) | 13.620 |
| Derivative of 3-phenyl-7-triazinylamino-coumarin | 1.500 |
| 2-benzoxazolethiol | 0.830 |
| Ethyl Michler's ketone (PART C) | 0.150 |
| 1-H-imidazole,2-(2-chlorophenyl)-4,5-diphenyl | 1.000 |
| Liquid Mixture Total: | 50.500 |
| % Solid (adjusted with deionized water) | 50.0 |

A four color positive proof was obtained following the process described in Example 2.

The following example describes a process which may be utilized to form a four color positive proof.

Example 5:

A polymeric structure composed of 48S Mylar® polyester film (DuPont), a colored photopolymer layer, an adhesive elastomeric layer, and a silicone release treated 92A Mylar® polyester film (DuPont) can be assembled by coating the colored photopolymer layer on to the 48S Mylar® polyester film at a thickness of 0.5–3.5 μm and laminating it to the elastomeric layer coated on the silicone release treated 92A Mylar® polyester film. The colored photopolymer layer is prepared as follows:

The composition of the organic liquid 100% solids is:

| INGREDIENT | (WEIGHT %) |
| --- | --- |
| Ethoxylated trimethylolpropanetriacrylate | 61.54 |
| Acrylic acid, 2-(6-(6-hydroxyhexanoyloxy) hexanoyloxy)ethyl ester | 10.80 |
| 2,3-diazabicyclo[3.2.2]non-2-ene-1,4,4-trimethyl-N,N'-dioxide | 0.09 |
| Benzophenone | 12.34 |
| 2-Ethylhexyl N,N-dimethyl-aminobenzoate | 5.24 |
| Ethyl Michler's ketone | |
| 4-methyl-4-trichloromethyl-2,5-cyclohexadiene-1-one | 1.00 |
| Colorant* | 3.50 |
| 31/1 block copolymer of propylene oxide/ethylene oxide | 7.09 |

*The Colorant may be any suitable dye or pigment dispersion know to one skilled in the art. Some typical examples would include Victoria Blue Dye, Victoria Green Dye, CI 109 red dye, Chromophthal ® Yellow 3G pigment, Quindo Magenta Pigment (RV6803), Carbon Black (Raven ® 1030), Heliogen ® Blue L6930, etc.

The composition of the colored photoimageable layer is as follows:

| INGREDIENT | (WEIGHT %) |
| --- | --- |
| Latex Polymer A | 65.65 |
| Triethanolamine(TEA) | 1.50 |
| Organic liquid 100% Solids | 32.80 |
| PVP K-90 | 0.025 |

The elastomeric adhesive used is a styrene-isoprene-styrene (SIS) block copolymer. Aqueous dispersions of other elastomeric or thermoplastic adhesives can also be used. Some typical examples would be Prinlin® B7216A, Pierce and Stevens Corporation, Buffalo, N.Y.; polyvinylacetate emulsions such as Vinac®, Air Products Corporation and Mowilith® emulsions from Hoechst-Celanese.

Four photopolymer emulsion layers, representing the four primary subtractive colors (yellow, magenta, cyan and black) are prepared and coated onto 48S Mylar® polyester film (DuPont) to form a 12 μm thick layer. A range of thicknesses from 0.5 to 30 μm may be coated. The coatings are dried for 1 minute at 87.8° C. and laminated with polyethylene.

Next, the elastomeric adhesive layer is coated on silicone release treated 92A Mylar® polyester film (DuPont) to form a 2–25 μm thick layer, and is subsequently, after drying, laminated to the dried colored photopolymer layer resulting in a composite film having the structure outlined above.

A four-color proof is then made using the following wash-off process. After peeling off the silicone release treated 92A Mylar® polyester film (DuPont), the yellow photopolymer composite film is laminated to a water impervious receptor such as polyethylene clad paper or Melinex® 994, (ICI), using a DuPont HRL 24 laminator at 110° C. and a throughput speed of 10.2 cm/min. The resulting laminate is exposed on a DuPont PC printer, through a yellow separation transparency, to 65 mj/cm$^2$ ultraviolet energy.

The 48S Mylar® polyester film (DuPont) is peeled off, and the sample is developed in 1% sodium carbonate in a spray processor set at 29° C. and 1.76 kg/m$^2$ for 10 to 12 seconds to yield a yellow glossy image of the yellow separation.

The process is sequentially repeated by laminating additional photopolymer composite film similar to that described above onto the yellow image containing receptor; exposing using magenta, cyan and black separations; removing the support and developing to yield a four color positive proof. An extra layer of photosensitive material is applied and blanket exposed to provide a protective coversheet to the proof.

Example 6:

This example illustrates the use of triethanolamine as a nonvolatile emulsion stabilizer in practicing the instant invention.

Stability to age was demonstrated in a series of emulsions prepared by adding triethanolamine (as an essentially nonvolatile stabilizer), solvent-free organic liquid (composition given below), and poly(vinylpyrrolidone) (as a coating aid) to a latex of styrene-acrylic polymer.

Successive preparations of an emulsion composition having 6.9 percent neutralization level were prepared 12 days, 7 days, and 3 hours before coating to determine the effect of aging on the coating properties of the emulsion.

The composition of the emulsion by weight was as follows:

| Ingredients | (Weight %) |
| --- | --- |
| Latex$^a$ @ 50.3% solids | 78.28 |
| TEA @ 50% in DI water | 1.88 |
| Organic liquid 100% solids | 19.69 |
| PVP K90 @ 10% in DI water | 0.1 |

$^a$This is the same latex as described in Example 1.

The composition of the organic liquid 100% solids was as follows:

| Ingredients | (Weight %) |
| --- | --- |
| Ethoxylated trimethylolpropane triacrylate | 61.54 |
| Acrylic acid, 2-(6-(6- hydroxyhexanoyloxy) hexanoyloxy)ethyl ester | 10.80 |
| 2,3-diazobicyclo[3,2,2]non-2-ene-1,4,4-trimethyl-N,N'-dioxide | 0.09 |
| Benzophenone | 12.34 |
| 2-Ethylhexyl N,N-dimethyl-aminobenzoate | 5.24 |
| Carboxybenzotriazole | 0.09 |
| 5-Chlorobenzotriazole | 0.02 |
| Ethyl Michler's ketone | 0.50 |
| 4-methyl-4-trichloromethyl-2,5-cyclohexadiene 1-one | 0.99 |
| Victoria blue dye | 0.08 |
| Vanillin | 0.03 |
| 31/1 block copolymer of propylene oxide/ ethylene oxide | 7.09 |
| Leuco crystal violet | 1.17 |

The composition of the photoimageable film was as follows:

| Ingredients | (Weight %) |
|---|---|
| Styrene-acrylic polymer | 65.65% |
| Triethanolamine(TEA) | 1.50 |
| Organic liquid 100% | |
| Solids | 32.80 |
| PVP K-90 | 0.025 |
| Total | 99.975 |

All emulsions prepared in multiple runs with the formulation described above were free of agglomerates. All emulsions coated satisfactorily on 1 mil (0.0254 mm) Mylar® polyester film on a laboratory coater. After drying for 1 min at 190° F. (88° C.), coatings were laminated with polyethylene to produce a high quality roll of dry film photoresist (resist).

The resist was laminated to brush-scrubbed copper-clad epoxy board on a DuPont HRL-24 hot roll laminator, then exposed through a printed circuit artwork to 65 mJ/cm2 ultraviolet energy on a DuPont PC-30 printer. Development in 1% sodium carbonate in a spray processor at 85 ° F. (29° C.) and 25 psi (1.76 kg/m2) for 25 sec gave a glossy durable resist image.

Panels electroplated through copper sulfate, then tin-lead solder and stripped in aqueous caustic (3% NaOH) at 125 degrees F (52° C.) followed by alkaline etching gave a high quality image pattern. Similarly, a panel electroplated through copper sulfate, nickel sulfamate, and gold gave a high quality image free of underplating.

Panels etched through cupric chloride at 120 degrees F (49° C.) and stripped in hot sodium hydroxide also gave a high quality image.

Panels which were laminated and held for 10 days, then exposed, and developed as above, were free of resist residue, and etched cleanly in alkaline etchant to sharply defined circuit lines.

What is claimed is:

1. A process for preparing an image on a substrate comprising, in order:
    (i) applying a photoimageable composition on a first polymeric film substrate, wherein the photoimageable composition, having a solids content from 25 to 60 weight percent, consists essentially of:
        (a) a partially neutralized acid-containing polymer formed from a precursor polymer having an acid number from 90 to 160 prior to neutralization and wherein 1 to 15% of acid-containing groups of the precursor polymer are neutralized with base;
        (b) an ethylenically unsaturated monomer;
        (c) a photoinitiator or photoinitiating system;
        (d) water; and
        (e) 0–25% by weight of an organic solvent based on the total weight of the organic solvent and water; wherein the liquid composition is present as a stable emulsion, and wherein the photoimageable composition has a Brookfield viscosity, at 25° C., from about 10 to about 2000 centipoise;
    (ii) drying the coated photoimageable composition to form a photoimageable layer on a first substrate;
    (iii) imagewise exposing the layer to actinic radiation to form imaged and non-imaged areas; and
    (iv) developing the exposed layer having imaged and non-imaged areas to form an image on the first film substrate, wherein the development is dry.

2. The process of claim 1 wherein between steps (ii) and (iii) the photoimageable composition is laminated to a copper clad epoxy glass board and the first polymeric film substrate is peeled off after step (iii).

3. The process of claim 1 wherein the photoimageable composition is pigmented.

4. The process of claim 1 wherein the photoimageable composition further comprises a colorant, and wherein the exposed layer is developed by laminating a second film substrate to the surface of the exposed layer having imaged and non-imaged areas and then separating the first and second film substrates resulting in the imaged areas remaining on the first substrate and the non-imaged areas being removed on the second substrate.

5. The process of claim 1 wherein the photoimageable composition further comprises a colorant, and wherein between steps (ii) and (iii), a second film substrate is laminated to the photoimageable layer.

6. The process of claim 5 wherein the exposed layer is developed by separating the first and second film substrates resulting in the imaged areas remaining on the first film substrate and the non-imaged areas being removed on the second film substrate.

7. The process of claim 1 wherein the exposed layer is developed by laminating a toning foil comprised of a support and a colorant-containing layer, to the surface of the exposed layer having imaged and non-imaged areas and then separating the first film substrate and the toning foil support resulting in the colorant-containing layer remaining in the non-imaged areas of the exposed layer.

8. The process of claim 1 wherein the first film substrate is selected from the group consisting of polyethylene terephthalate, metal-clad epoxy glass board, anodized aluminum, paper, polyethylene-clad paper, polycarbonate and polypropylene.

9. The process of claim 1 wherein not greater than 10% of the acid groups of the polymer are neutralized, wherein the emulsion is stable for at least twenty four hours, wherein the liquid composition has a Brookfield viscosity at 25° C. of from about 15 to about 500 centipoise, and wherein the liquid composition has a solids content of from 35 to 50 weight percent.

10. The process of claim 1 wherein the base has a boiling point of at least 90° C. at a pressure of 760 mm of mercury.

11. The process of claim 1 wherein the base is selected from the group consisting of ammonium hydroxide, sodium hydroxide and potassium hydroxide.

12. The process of claim 1, wherein the base has the formula:

$NR_1R_2R_3$ wherein $R_1$, $R_2$, $R_3$ are independently H, —OH, or unsubstituted or substituted C1–C20 alkyl, up to 20 carbons aralkyl, up to 20 carbons cycloalkyl, or up to 20 carbons aryl.

13. The process of claim 12 wherein the base is triethanolamine, diethanolamine, monoethanolamine, 2-N, N-dialkylaminoalkyl acrylate, or 2-N,N-dialkylaminoalkyl methacrylate.

14. The process of claim 1 wherein the partially neutralized polymer contains carboxyl groups.

15. The process of claim 1 wherein the photoimageable composition further comprises up to 5% of a solution polymer, based on the weight of the total polymer present in the composition.

16. The process of claim 1, wherein the exposed layer is developed with a dry toner.

17. A process for preparing an image on a substrate comprising, in order:
  (i) applying a photoimageable composition on a first polymeric film substrate, wherein the photoimageable composition, having a solids content from 25 to 60 weight percent, consists essentially of:
    (a) a partially neutralized acid-containing polymer formed from a precursor polymer having an acid number from 90 to 160 prior to neutralization and wherein 1 to 15% of acid-containing groups of the precursor polymer are neutralized with base;
    (b) an ethylenically unsaturated monomer;
    (c) a photoinitiator or photoinitiating system;
    (d) water; and
    (e) 0–25% by weight of an organic solvent based on the total weight of the organic solvent and water; wherein the liquid composition is present as a stable emulsion, and wherein the photoimageable composition has a Brookfield viscosity, at 25° C., from about 10 to about 2000 centipoise;
  (ii) drying the coated photoimageable composition to form a photoimageable layer on a first substrate;
  (iii) imagewise exposing the layer to actinic radiation to form imaged and non-imaged areas; and
  (iv) developing the exposed layer having imaged and non-imaged areas to form an image on the first film substrate, wherein the development is dry and wherein the exposure and development of the photomageable composition occurs simultaneously to form a print-out image.

18. The process of claim 17 wherein the photoimageable composition which forms a print-out image upon exposure comprises the following combinations selected from the group consisting of 2,2'-bis(o-chlorophenyl) -4,4',5,5'-tetraphenyl-1,1'-biimidazole and Leuco Crystal Violet; 1,2-dibromotetrachloroethane and Leuco Crystal Violet; tribromomethyl phenylsulfone (BMPS) and Leuco Crystal Violet; and 2,3- dibromo-3-phenylpropiophenone (BPP) and Leuco Crystal Violet.

* * * * *